(12) United States Patent
Yoo et al.

(10) Patent No.: US 7,710,021 B2
(45) Date of Patent: May 4, 2010

(54) ORGANIC ELECTROLUMINESCENT DISPLAY DEVICE AND METHOD OF FABRICATING THE SAME

(75) Inventors: Choong-Keun Yoo, Incheon (KR); Kong-Ju Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 503 days.

(21) Appl. No.: 11/819,286

(22) Filed: Jun. 26, 2007

(65) Prior Publication Data
US 2008/0122372 A1 May 29, 2008

(30) Foreign Application Priority Data
Jun. 26, 2006 (KR) .................. 10-2006-0057344

(51) Int. Cl.
*H01L 51/00* (2006.01)
(52) U.S. Cl. .................. 313/504; 313/506; 445/24
(58) Field of Classification Search .................. 313/504, 313/506; 445/24
See application file for complete search history.

(56) References Cited
U.S. PATENT DOCUMENTS 7,442,956 B2 * 10/2008 Yamada .................. 257/59
7,518,147 B2 * 4/2009 Bae et al. .................. 257/72
2004/0014251 A1 * 1/2004 Park et al. .................. 438/22
2004/0017151 A1 * 1/2004 Kim et al. .................. 313/504
2005/0189872 A1 * 9/2005 Park et al. .................. 313/500
2006/0119260 A1 * 6/2006 Kim .................. 313/506

* cited by examiner

*Primary Examiner*—Karabi Guharay
(74) *Attorney, Agent, or Firm*—Morgan Lewis & Bockius LLP

(57) ABSTRACT

An organic electroluminescent display (OELD) device comprises a first electrode on a first substrate having an active region and a non-active region at periphery of the active region, the active region including a plurality of pixel regions and the non-active region including a power supply region; an organic luminescent layer on the first electrode in the plurality of pixel regions; a first organic layer on the first electrode in the power supply region; a second organic layer on the first substrate in an outer region of the power supply region; a second electrode on the organic luminescent layer; a driving thin film transistor connected to the second electrode and formed on a second substrate; and a power supply terminal connected to the first organic layer and formed on the second substrate, wherein the first organic layer has substantially the same shape as the organic luminescent layer, and the second organic layer has substantially a different shape from the organic luminescent layer.

14 Claims, 3 Drawing Sheets

ORGANIC ELECTROLUMINESCENT DISPLAY DEVICE AND METHOD OF FABRICATING THE SAME

The present application claims the benefit of Korean Patent Application No. 2006-0057344 filed in Korea on Jun. 26, 2006, which is hereby incorporated by reference.

BACKGROUND OF THE INVENTION

1. Field of the Invention

The present invention relates to an organic electroluminescent display (OELD) device, more particularly, to an OELD device and a method of fabricating the OELD device using a shadow mask.

2. Discussion of the Related Art

Recently, a flat panel display device, such as a plasma display panel (PDP), a liquid crystal display (LCD) device and an OELD device, is developed and used instead of a cathode ray tube (CRT). Among these flat panel display device, since the OELD device, which is a self-luminance type, does not require a backlight unit as a light source, it is capable of being thin and light. Compared with the LCD device, the OELD device has a wide viewing angle, high contrast ratio and low power consumption. Moreover, the OELD device can be driven with low direct current voltages and has a fast response time. In addition, the OELD device has a strong durability to impacts and has low production costs.

Generally, in the OELD device, both array elements including a driving thin film transistor (TFT), and an organic luminescent diode are formed on a single substrate. Accordingly, production yield of the OELD device depends on production yield of the single substrate. Even if one of the array elements and the organic luminescent diode has defects, the OELD device is concluded to an inferior good. Accordingly, production yield of the OELD device decreases.

To this problem, a dual-panel type OELD device is suggested. In the dual-panel type, an array element and an organic luminescent diode are formed on different substrates from each other. Accordingly, production yield increases. In a process of fabricating an organic luminescent diode on a substrate, an organic luminescent layer is formed using a shadow mask having a stripe pattern.

FIG. 1 is a schematic plane view showing a shadow mask for fabricating a dual-panel type OELD device according to the related art. As shown in FIG. 1, the shadow mask SM includes a plurality of blocking portions 10 and a plurality of openings 20 between the plurality of blocking portions 10. An organic luminescent material is deposited on a substrate through the plurality of openings 20 to form an organic luminescent layer.

The above-mentioned shadow mask SM is fabricated through an etching process. Unfortunately, a blocking portion 10 at end sides of the shadow mask SM has undesired width due to an error in the etching process. Accordingly, the plurality of blocking portions 10 are divided into normal patterns S1 and dummy patterns S2. The dummy patterns S2 have an undesired width and are disposed at both end sides of the shadow mask SM. The normal patterns S1 have a desired width and are disposed between the dummy patterns S2. Accordingly, the normal pattern S1 are disposed to correspond to a pixel region, the dummy pattern S2 are disposed to corresponds to a dummy pixel region at a periphery of the pixel region, and thereby forming a desired organic luminescent layer in the pixel region. The more the shadow mask SM has the dummy patterns S2, the greater an uniformity of width of normal patterns S1. As a result, the more the shadow mask SM has the dummy patterns S2, the greater production yield is.

In an OELD device adopting a chip on glass (COG) type, there is a limitation for the dummy patterns. Namely, in the COG type, a power supply terminal of the array substrate contacts an electrode of an organic luminescent diode to apply a power to the organic luminescent diode. Since there is a narrow space, where the dummy pixel region is formed, due to the COG type, the shadow mask does not have sufficient dummy patterns such that a uniformity in the width of the normal pattern degraded. A displaying quality is deteriorated.

SUMMARY OF THE INVENTION

Accordingly, the present invention is directed to a shadow mask, an organic electroluminescent display (OELD) device fabricated using the shadow mask and a method of fabricating the OELD device that substantially obviates one or more of the problems due to limitations and disadvantages of the related art.

An object of the present invention is to provide an OELD device being capable of displaying high quality images.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display (OELD) device comprises a first electrode on a first substrate having an active region and a non-active region at periphery of the active region, the active region including a plurality of pixel regions and the non-active region including a power supply region; an organic luminescent layer on the first electrode in the plurality of pixel regions; a first organic layer on the first electrode in the power supply region; a second organic layer on the first substrate in an outer region of the power supply region; a second electrode on the organic luminescent layer; a driving thin film transistor connected to the second electrode and formed on a second substrate; and a power supply terminal connected to the first organic layer and formed on the second substrate, wherein the first organic layer has substantially the same shape as the organic luminescent layer, and the second organic layer has substantially a different shape from the organic luminescent layer.

In another aspect of the present invention, a method of fabricating an organic electroluminescent display device comprises forming a first electrode on a first substrate having an active region and a non-active region at periphery of the active region, the active region including a plurality of pixel regions and the non-active region including a power supply region and a sealing region, the sealing region disposed at an outmost portion of the second substrate; disposing a shadow mask having first and second portions over the first electrode, the first portion corresponding to the active region and the power supply region and having a plurality of first openings, the second portion corresponding to an outer region of the power supply region and having a plurality of second openings; forming an organic luminescent layer on the first electrode using the shadow mask; forming a second electrode on the organic luminescent layer, wherein the organic luminescent layer in the power supply region exposed through the second electrode; forming a driving thin film transistor corresponding to the plurality of pixel regions on a second substrate; forming a power supply terminal corresponding to the power supply region on the second substrate; and attaching the first and second substrates such that the driving thin film transistor faces the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
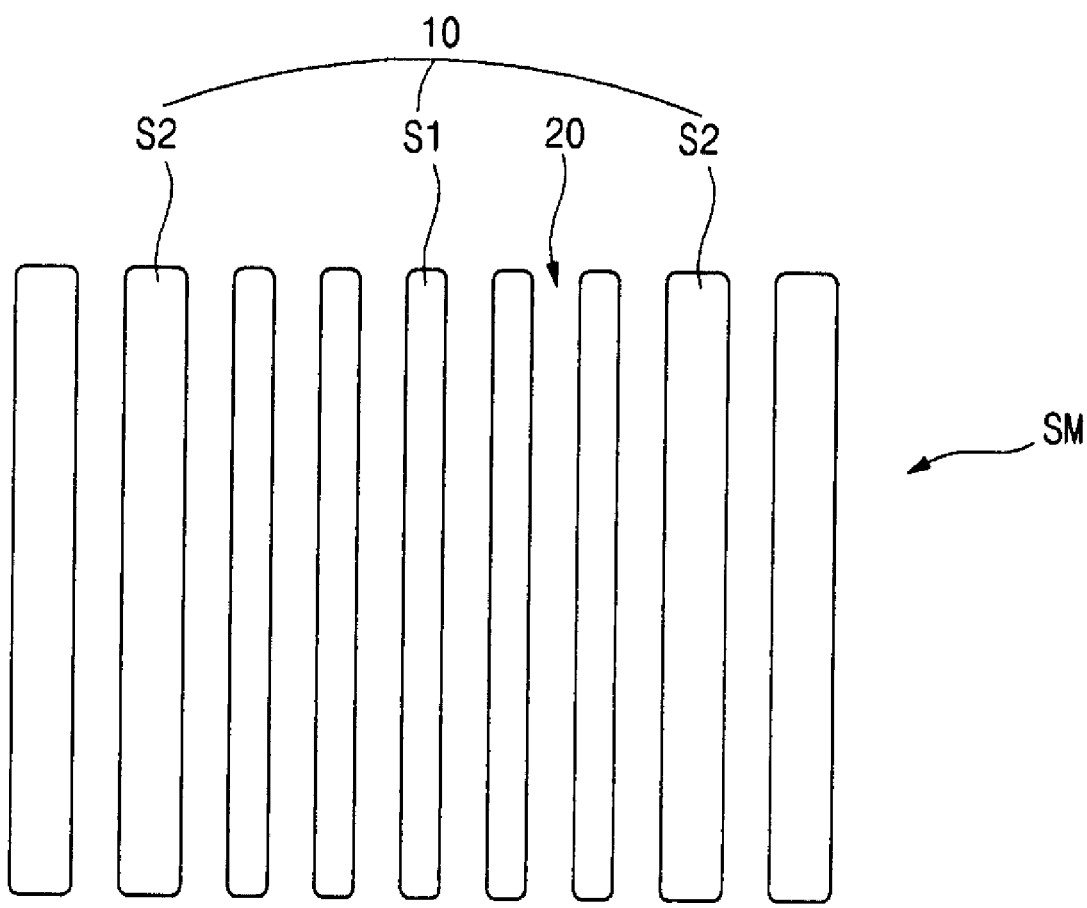
FIG. 1 is a schematic plane view showing a shadow mask for fabricating a dual-panel type OELD device according to the related art.
Figure 2:
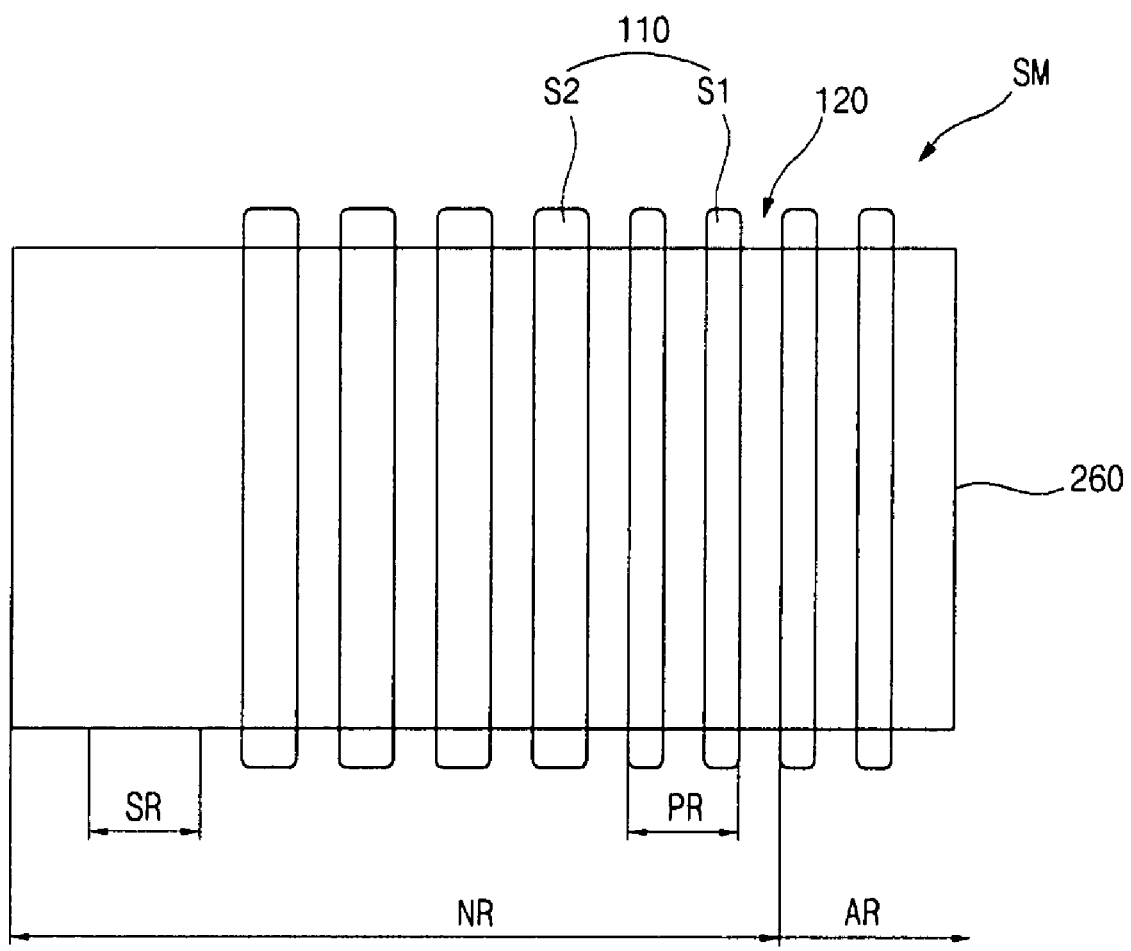
FIG. 2 is a schematic plane view showing a shadow mask for fabricating an OELD device and a portion of a substrate of the OELD device according to the present invention.

FIG. 2 is a schematic plane view showing a shadow mask for fabricating an OELD device and a portion of a substrate of the OELD device according to the present invention. As shown in FIG. 2, a shadow mask SM in the present invention includes a plurality of blocking portions 110 and a plurality of openings 120. Each of the plurality of openings 120 is disposed between two adjacent blocking portions 110. An organic luminescent material is deposited through the plurality of openings 120 to a first substrate 260 to form an organic luminescent layer. Although not shown, the organic luminescent diode constitutes an organic luminescent diode with first and second electrodes.

The above-mentioned shadow mask SM is fabricated through an etching process. Unfortunately, a blocking portion 110 at end sides of the shadow mask SM has undesired width due to an error in the etching process. Accordingly, the plurality of blocking portions 110 are divided into normal patterns S1 and dummy patterns S2. The first substrate 260 including an active region AR and a non-active region NR. The non-active region NR corresponds to a portion of the substrate except for the active region AR. The active region AR includes a pixel region and a dummy pixel region at periphery of the pixel region. The pixel region functions as a desired image displaying region, but the dummy pixel region does not function that.

On the other hand, the non-active region NR includes a power supply region PR and a sealing region SR. A power supply terminal (not shown) in the power supply region PR is connected to the first electrode, to supply a power to the first electrode of the organic luminescent diode. The power supply terminal (not shown) is formed in the power supply region PR on a second substrate facing the first substrate. Although not shown, the power supply terminal is connected to the first electrode through a power supply pattern. Accordingly, a power of a power supplier is applied to the first electrode through the power supply terminal and the power supply pattern. For example, the power supplier and a chip is directly connected to a power pad on the second substrate, and the power supply terminal having a power supplying line at one end of the power supply terminal is connected to the power pad. The power of the power supplier is applied to the first electrode.

A seal pattern is formed in the sealing region SR. The seal pattern attaches the first substrate with the second substrate.

The dummy pattern S2 of the shadow mask SM corresponds to a periphery of the power supply region PR. An outmost dummy pattern S2 may correspond to the sealing region SR. In this case, the normal pattern S1 of the shadow mask SM may correspond to the power supply region PR. Since the dummy pattern S2 may correspond to the power supply region PR in the non-active region NR, the shadow mask SM may have sufficient dummy patterns S2 and an improved uniformity in the width of the normal pattern S1.

The shadow mask SM is disposed over the first substrate 260, and an organic luminescent material is deposited on the first substrate 260 through the plurality of openings 120 to form the organic luminescent layer. Since the normal pattern S1 corresponding to the pixel region has an excellent uniformity in widths of the blocking patterns 110 and the openings 120, the organic luminescent layer formed in the pixel region has a desired pattern. On the other hand, since the dummy pattern S2 corresponding to the power supply region PR or the sealing region SR has a poor uniformity in widths of the blocking patterns 110 and the openings 120, the organic luminescent layer formed in the power supply region PR or the sealing region SR has an undesired pattern. Since both the power supply region PR and the sealing region SR do not functions as an image displaying region, the undesired organic luminescent layer does not cause a quality of displaying images to be deteriorated. As a result, the organic luminescent layer in the pixel region has an improved uniformity, and the OELD device is capable of displaying high quality images.

Figure 3:
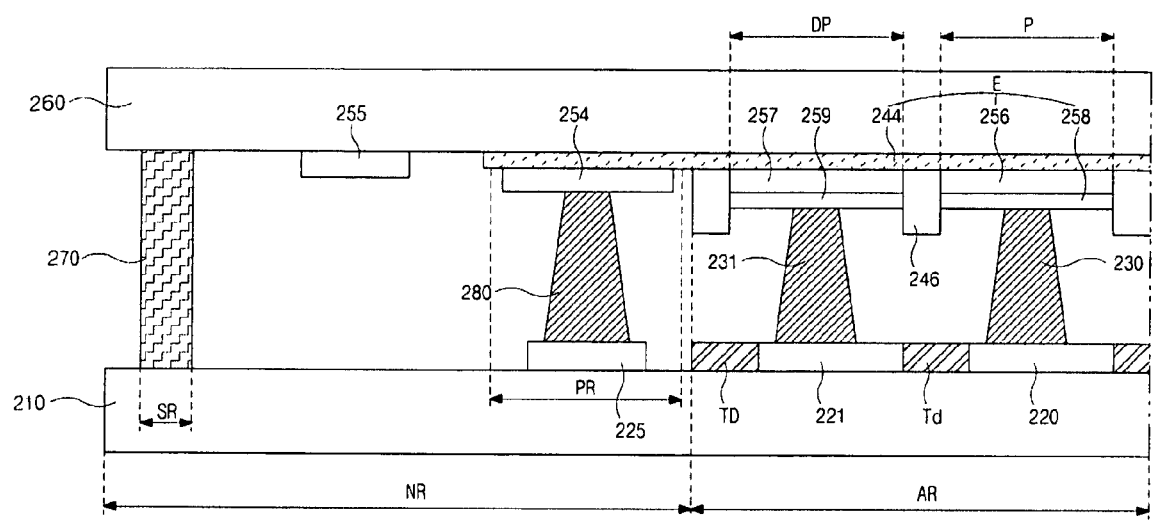
FIG. 3 is a schematic cross-sectional view showing a dual-panel type OELD device fabricated using a shadow mask according to the present invention.

FIG. 3 is a schematic cross-sectional view showing a dual-panel type OELD device fabricated using a shadow mask according to the present invention. As shown in FIG. 3, a dual-panel type OELD device includes first and second substrates 210 and 260 facing each other. An active region AR including a dummy pixel region DP and a pixel region P and a non-active region NR including a power supply region PR and a sealing region SR are defined on the first and second substrates 260 and 210. An organic luminescent diode E is formed on the first substrate 260, and a driving thin film transistor (TFT) Td is formed on the second substrate 210. The organic luminescent diode E includes a first electrode 244, an organic luminescent layer 256 and a second electrode 258. The organic luminescent layer 256 is formed using the shadow mask SM (of FIG. 2) and has an excellent uniformity and a desired pattern in the pixel region P. The normal pattern S1 (of FIG. 2) may correspond to the dummy pixel region DP and the power supply region PR. In this case, a dummy organic luminescent layer 257 and a first organic pattern 254 are formed on the dummy pixel region DP and the power supply region PR, respectively, when the organic luminescent layer 256 is formed in the pixel region P. Since the dummy organic luminescent layer 257 and the first organic pattern 254 correspond to the normal pattern S1 (of FIG. 2), they has an excellent uniformity and a desired pattern. Namely, the organic luminescent layer 256, the dummy organic luminescent layer 257 and the first organic pattern 254 have the same width.

On the other hand, a second organic pattern 255 is formed in an outer region of the power supply region PR. The second organic pattern 255 may be formed in a region between the power supply region PR and the sealing region SR. The second organic pattern 255 is formed through the dummy pattern S2 (of FIG. 2) to have a poor uniformity and an undesired pattern.

The first electrode 244 is formed on an inner side of the first substrate 260. The first electrode 244 corresponds to both the active region AR and the power supply region PR. A partition 246 is formed on the first electrode 244. The partition 246 is formed between the dummy pixel region DP and the pixel region P, between two adjacent dummy pixel regions DP and between two adjacent pixel regions P to isolate them. When the organic luminescent material is deposited on the first electrode 244, the organic luminescent layer 256 and the dummy organic luminescent layer 257 are separated due to the partition 246. A second electrode 258 is formed on the organic luminescent layer 256 in the pixel region P, and a dummy electrode 259 is formed on the dummy organic luminescent layer 257 in the dummy pixel region DP. Since the dummy pixel region DP and the pixel region P is separated due to the partition 246, the second electrode 258 and the dummy electrode 259 are also separated from each other. The second electrode 258 in each pixel region P is separated due to the partition 246. The first electrode 244, the organic luminescent layer 256 and the second electrode 258 in the pixel region P constitute the organic luminescent diode E.

On the other hand, an array element including a driving thin film transistor (TFT) Td and a connecting electrode 220 is formed on the second substrate 210 in the pixel region P. Although not shown, a gate line, a data line and a switching TFT are formed on the second substrate 210. The gate line and the data line cross each other to define the pixel region P. The switching TFT is connected to the data line and the gate line. Each of the driving TFT Td and the switching TFT includes a gate electrode, a source electrode and a drain electrode. The gate electrode of the switching TFT is connected to the gate line, and the source electrode of the switching TFT is connected to the data line. The drain electrode of the switching TFT is connected to the gate electrode of the driving TFT Td. The connecting line 220 is connected to the drain electrode of the driving TFT Td.

The dummy pixel region DP in the second substrate 210 has substantially the same structure as the pixel region P in the second substrate 210. For example, a dummy TFT TD and a dummy connecting electrode 221 are formed in the dummy pixel region DP.

A connecting pattern 230 in the pixel region P is disposed between the first and second substrates 260 and 210. The second electrode 258 is connected to the connecting electrode 220 through the connecting pattern 230. Since the connecting electrode 220 is connected to the drain electrode (not shown) of the driving TFT Td, the second electrode 258 of the organic luminescent diode E is connected to the driving TFT Td. Similarly, a dummy connecting pattern 231 is formed in the dummy pixel region DP with connected the dummy electrode 259 to the dummy connecting electrode 221.

On the other hand, a power supply terminal 225 is formed in the power supply region PR on the second substrate 210. The power supply terminal 225 receives a power from a power supplier (not shown). The power supply terminal 225 corresponds to the first organic pattern 225 in the power supply region PR on the first substrate 210. A power supply pattern 280 contacts both the power supply terminal 225 and the first organic pattern 225 to electrically connect them. As a result, the power supply terminal 225 is electrically connected to the first electrode 244 in the power supply region PR on the first substrate 260 through the power supply pattern 280 and the first organic pattern 254. The first organic pattern 254 has substantially low thickness to have a relatively low resistance. For example, the first organic pattern 254 has a thickness with a range of about 200 angstroms to about 400 angstroms. As a result, a power of the power supplier is applied to the first electrode 244.

A seal pattern 270 is formed between the first and second substrates 260 and 210 in the sealing pattern SR to attaching the first and second substrates 260 and 210. The seal pattern 270 is disposed along an edge portion of the first and second substrates 260 and 210. A chip (not shown) is disposed on the second substrate 210 from an out side of the sealing region SR.

A method of fabricating an OELD device according to the present invention is explained with FIG. 3. The first electrode 244 is formed in the active region AR and the power supply region PR on the first substrate 260. The partition 246 is formed on the first electrode 244. The partition 246 separates the pixel region P and the dummy pixel region DP. The shadow mask SM (of FIG. 2) is disposed over the first substrate 260. The normal pattern S1 (of FIG. 2) corresponds to the active region AR and the power supply region PR, and the dummy pattern S2 (of FIG. 2) corresponds to an outer space of the power supply region PR. Next, an organic luminescent material is deposited on the first electrode 244 using the shadow mask SM (of FIG. 2) to form the organic luminescent layer 256 in the pixel region P, the dummy organic luminescent layer 257 in the dummy pixel region DP and the first organic pattern 254 in the power supply region PR. Since the organic luminescent layer 256, the dummy organic luminescent layer 257 and the first organic pattern 254 are formed through the normal pattern S1 (of FIG. 2) of the shadow mask SM (of FIG. 2), they have an excellent uniformity and a desired pattern. The organic luminescent layer 256, the dummy organic luminescent layer 257 and the first organic pattern 254 are separated from one another due to the partition 246. At the same time, the second organic pattern 255 is formed in an outer region of the power supply region PR on the first substrate 260. Since the second organic pattern 255 is formed through the dummy pattern S2 (of FIG. 2) of the shadow mask SM (of FIG. 2), the second organic pattern 255 has a poor uniformity and an undesired pattern.

Next, the second electrode 258 and the dummy electrode 259 are formed on the organic luminescent layer 256 and the dummy organic luminescent layer 257, respectively. The second electrode 258 and the dummy electrode 259 are separated from each other due to the partition 246. Although not shown in FIG. 3, the first and second organic patterns 254 and 255 in the non-active region NR may be removed before the second electrode 258 is formed.

On the other hand, the array element including the driving TFT Td, the dummy TFT TD and the power supply terminal 280 are formed on the second substrate 210. The connecting pattern 230, the dummy connecting pattern 231 and the power connecting pattern 280 are formed on the second substrate 210. The connecting pattern 230 is formed on the connecting electrode 220 to connect the connecting electrode 220 with the second electrode 258. The dummy connecting pattern 231 is formed on the dummy connecting electrode 220. The power connecting pattern 280 is formed on the power supply terminal 225 to connect the power supply terminal 225 with the first organic pattern 254. When the first organic pattern 254 is removed, the power connecting pattern 280 directly connects the power supply terminal 225 to the first electrode 244. The connecting pattern 230, the dummy connecting pattern 231 and the power connecting pattern 280 may be formed on the first substrate 260.

Next, the seal pattern 270 is formed along an edge portion of one of the first and second substrates 260 and 210. Then, the first and second substrates 260 and 210 attached to each other using the seal pattern 270. After attaching the first and second substrates 260 and 210, the chip is disposed on the second substrate 210 by a chip on glass (COG) type.

Through the above-mentioned processes, the OELD device according to the present invention is fabricated. In the present invention, since the dummy pattern of the shadow mask corresponds to the power supply region, the shadow mask has a relatively wide dummy pattern such that the normal pattern of the shadow mask has an excellent uniformity. Accordingly, a uniformity of the organic luminescent layer fabricated through the normal pattern of the shadow mask is improved, and the OELD device is capable of displaying high quality images.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (OELD) device, comprising:
    a first electrode on a first substrate having an active region and a non-active region at periphery of the active region, the active region including a plurality of pixel regions and the non-active region including a power supply region;
    an organic luminescent layer on the first electrode in the plurality of pixel regions;
    a first organic layer on the first electrode in the power supply region;
    a second organic layer on the first substrate in an outer region of the power supply region;
    a second electrode on the organic luminescent layer;
    a driving thin film transistor connected to the second electrode and formed on a second substrate; and
    a power supply terminal connected to the first organic layer and formed on the second substrate,
    wherein the first organic layer has substantially the same shape as the organic luminescent layer, and the second organic layer has substantially a different shape from the organic luminescent layer.

2. The device according to claim 1, further comprising a dummy organic luminescent layer having substantially the same pattern as the organic luminescent layer on the first electrode and corresponding to a dummy pixel region, the dummy pixel region included in the active region and disposed at periphery of the plurality of pixel regions.

3. The device according to claim 2, further comprising a dummy electrode and a dummy thin film transistor, wherein the dummy electrode is formed on the dummy organic luminescent layer, and wherein the dummy thin film transistor is formed on the second substrate and connected to the dummy electrode.

4. The device according to claim 3, further comprising a connecting pattern connecting the driving thin film transistor to the second electrode and a power supply pattern connecting the power supply terminal to the first organic layer.

5. The device according to claim 4, further comprising a dummy connecting pattern connecting the dummy thin film transistor to the dummy electrode.

6. The device according to claim 5, wherein the connecting pattern, the power supply pattern and the dummy connecting pattern are formed of the same material.

7. The device according to claim 1, further comprising a partition on the first electrode between adjacent two pixel regions.

8. The device according to claim 7, wherein the organic luminescent layer are separated by the partition.

9. The device according to claim 1, further comprising a seal pattern at an edge portion of at least one of the first and second substrates.

10. A method of fabricating an organic electroluminescent display device, comprising:
    forming a first electrode on a first substrate having an active region and a non-active region at periphery of the active region, the active region including a plurality of pixel regions and the non-active region including a power supply region and a sealing region, the sealing region disposed at an outmost portion of the first substrate;
    disposing a shadow mask having first and second portions over the first electrode, the first portion corresponding to the active region and the power supply region and having a plurality of first openings, the second portion corresponding to an outer region of the power supply region and having a plurality of second openings;
    forming an organic luminescent layer on the first electrode using the shadow mask;
    forming a second electrode on the organic luminescent layer, wherein the organic luminescent layer in the power supply region exposed through the second electrode;
    forming a driving thin film transistor corresponding to the plurality of pixel regions on a second substrate;
    forming a power supply terminal corresponding to the power supply region on the second substrate; and
    attaching the first and second substrates such that the driving thin film transistor faces the second electrode.

11. The method according to claim 10, wherein the second portion of the shadow mask extends to the sealing region.

12. The method according to claim 10, wherein the second portion of the shadow mask extends over the sealing region.

13. The method according to claim 10, further comprising forming a connecting pattern connecting the driving thin film transistor to the second electrode and a power supply pattern connecting the power supply terminal to the exposed organic luminescent layer.

14. The method according claim 10, further comprising forming a partition on the first electrode between adjacent two pixel regions before disposing the shadow mask over the first electrode.

* * * * *